United States Patent
Goux et al.

(10) Patent No.: US 9,685,229 B2
(45) Date of Patent: Jun. 20, 2017

(54) METHOD FOR OPERATING A CONDUCTIVE BRIDGING MEMORY DEVICE

(71) Applicants: IMEC VZW, Leuven (BE); Katholieke Universiteit Leuven, KU LEUVEN R&D, Leuven (BE)

(72) Inventors: Ludovic Goux, Leuven (BE); Attilio Belmonte, Leuven (BE)

(73) Assignees: IMEC VZW, Leuven (BE); Katholieke Universiteit Leuven, KU Leuven R&D, Leuven (BE)

(*) Notice: Subject to any disclaimer, the term of this patent is extended or adjusted under 35 U.S.C. 154(b) by 0 days.

(21) Appl. No.: 14/957,249

(22) Filed: Dec. 2, 2015

(65) Prior Publication Data

US 2016/0155502 A1    Jun. 2, 2016

(30) Foreign Application Priority Data

Dec. 2, 2014  (EP) .................................. 14195848

(51) Int. Cl.
| | | |
|---|---|---|
| G11C 11/00 | (2006.01) |
| G11C 13/00 | (2006.01) |
| G11C 11/56 | (2006.01) |
| H01L 45/00 | (2006.01) |
| H01L 27/24 | (2006.01) |

(52) U.S. Cl.
CPC ...... *G11C 13/0069* (2013.01); *G11C 11/5614* (2013.01); *G11C 13/0011* (2013.01);
(Continued)

(58) Field of Classification Search
CPC ..................................................... G11C 11/00
(Continued)

(56) References Cited

U.S. PATENT DOCUMENTS

| 7,852,095 B2* | 12/2010 | Ruf | G01R 1/07385 324/754.07 |
| 8,804,399 B2* | 8/2014 | Sills | G11C 11/5685 365/148 |
| 2004/0124407 A1 | 7/2004 | Kozicki | |
| 2008/0231295 A1* | 9/2008 | Ruf | G01R 31/31905 324/754.07 |
| 2008/0259676 A1 | 10/2008 | Ruf | |
| 2013/0250651 A1* | 9/2013 | Sills | G11C 11/5685 365/148 |

OTHER PUBLICATIONS

European Search Report, Application No. EP15197307.0, Apr. 15, 2016.

(Continued)

*Primary Examiner* — Harry W Byrne
(74) *Attorney, Agent, or Firm* — McDonnell Boehnen Hulbert & Berghoff LLP

(57) ABSTRACT

A method is disclosed for operating a Conductive Bridge Random Access Memory (CBRAM) device that includes an electrolyte element sandwiched between a cation supply top electrode and a bottom electrode. The method comprises conditioning the CBRAM device by applying a forming current pulse having a pulse width ($t_f$) of 100 ns or less and a pulse amplitude ($I_f$) of 10 uA or less, and when programming, setting the conditioned CBRAM device to a Low Resistance State (LRS) by applying a set current pulse having a pulse width ($t_s$) of 100 ns or less and a pulse amplitude ($I_s$) equal to or larger than the forming current pulse amplitude ($I_f$).

11 Claims, 2 Drawing Sheets

(52) U.S. Cl.
CPC ........ *H01L 27/2463* (2013.01); *H01L 45/085* (2013.01); *H01L 45/1233* (2013.01); *H01L 45/1266* (2013.01); *H01L 45/145* (2013.01); *H01L 45/146* (2013.01); *G11C 2013/0078* (2013.01); *G11C 2013/0083* (2013.01); *G11C 2013/0088* (2013.01); *G11C 2013/0092* (2013.01)

(58) Field of Classification Search
USPC ....... 365/46, 51, 52, 94, 100, 129, 148, 158, 365/163
See application file for complete search history.

(56) References Cited

OTHER PUBLICATIONS

Belmonte et al., A Thermally Stable and High-Performance 90-nm Al2O3\Cu-Based 1T1R CBRAM Cell, IEEE Transactions On Electron Devices, Pisacataway, NJ, vol. 60, No. 11, Nov. 2013, pp. 3690-3695.

Bai et al., Low Power W:AlOx/WOx Bilayer Resistive Switching Structure Based on Conductive Filament Formation and Rupture Mechanism, Applied Physics Letters, vol. 102, Apr. 2013, pp. 173503-1-4.

\* cited by examiner

METHOD FOR OPERATING A CONDUCTIVE BRIDGING MEMORY DEVICE

CROSS-REFERENCE TO RELATED APPLICATION

This application claims priority to European Patent Application No. 14195848.8 filed on Dec. 2, 2014, the contents of which are hereby incorporated by reference.

BACKGROUND

In the field of resistive-switching Random Access Memory (RRAM) devices, a Conductive Bridging Random Access Memory (CBRAM) device is considered a valuable non-volatile storage technology. It offers high endurance, reduced variability and good scalability.

A CBRAM device contains an insulating layer sandwiched between an active top electrode providing metal cations, e.g. $Cu^+$ or $Ag^+$, and an inert bottom electrode that does not provide such metal cations. The operation of the CBRAM device relies on the voltage-induced redox-based formation and rupture of a metal-based, e.g. Cu or Ag, conductive filament (CF) in the insulating layer acting as a solid state electrolyte.

When an electrical field is applied between both top and bottom electrodes, metal cations provided by the active top electrode drift towards the opposite inert bottom electrode through the insulating layer thereby forming the conductive filament. As a result, during operation, the CBRAM device can be reversibly switched between a high resistive (HRS) or reset state and a low resistive (LRS) or set state.

After manufacturing the CBRAM device and before putting it into operation, a forming step is applied to each CBRAM device to create an initial conductive filament therein. Such a forming step requires a current pulse having a long pulse width and a large pulse height, typically more than 50 uA during 1 second or more. These forming conditions make the forming step a time-consuming process.

In addition, the current conditions of this forming step determine the programming current conditions, as typically the same high current level is used for forming and for programming to improve the memory window of the CBRAM device, i.e. the difference in resistance between the reset and set state.

These current conditions also determine the feasibility of using CBRAM as a replacement for flash memory devices, requiring both fast programming times, low forming/programming current densities and a sufficient memory window.

Hence, there is a need for a CBRAM device that does not suffer from one or more of the above shortcomings of the state-of-the-art CBRAM devices.

Preferably such CBRAM device should be manufactured in a CMOS compatible way.

SUMMARY

The present disclosure relates to resistive-switching Random Access Memory (RRAM) devices, in particular to Conductive Bridging Random Access Memory devices, also known as CBRAM devices. In particular, the disclosure relates to a method for operating such conductive bridging memory device.

A method is disclosed for operating a memory comprising at least one Conductive Bridge Random Access Memory (CBRAM) device, the memory device comprising an electrolyte element sandwiched between a cation supply top electrode and an inert bottom electrode. The method comprises conditioning the memory device by applying a forming current pulse having a pulse amplitude ($I_f$) of 10 uA or less. In one example, the pulse amplitude ($I_f$) is 1 uA or less. In another example, the forming current pulse has a pulse width ($t_f$) of 100 ns or less.

The memory may comprise an array of the memory (CBRAM) devices, whereby the memory devices in the array are conditioned in parallel.

The conditioned memory device is set to a Low Resistance State (LRS) by applying a set current pulse having a pulse width ($t_s$) of 100 ns or less, and a current pulse amplitude ($I_s$) equal to or higher than the forming current pulse amplitude ($I_f$). In one example, the set current pulse amplitude ($I_s$) is above 10 uA.

The set current pulse amplitude ($I_s$) can be determined in view of or based on a Low Resistance State selected from a set of Low Resistance States, thereby allowing multilevel programming.

The cation supply electrode of the memory device may comprise copper or silver. The bottom electrode of the memory device may comprise tungsten or titanium-nitride. The electrolyte element of the memory device may comprise alumina-oxide, silicon-oxide, tungsten-oxide, silicon-nitride, or a combination thereof.

BRIEF DESCRIPTION OF THE FIGURES

For the purpose of teaching, drawings are added. These drawings illustrate some aspects and embodiments of the disclosure. They are only schematic and non-limiting. The size of some of the elements may be exaggerated and not drawn on scale for illustrative purposes. The dimensions and the relative dimensions do not correspond to actual reductions to practice of the disclosure. Like features are given the same reference number.

DETAILED DESCRIPTION

The present disclosure will be described with respect to particular embodiments and with reference to certain drawings but the disclosure is not limited thereto. Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein. Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The present disclosure relates to the forming of a CBRAM device using a forming current pulse of lower width ($t_f$) and height ($I_f$) than in conventional techniques, which reduces the time required to condition a pristine CBRAM device. As this programming current ($I_f$) is reduced, multiple pristine CBRAM (1) devices can be conditioned in parallel. This parallel conditioning of an array of CBRAM (1) devices may be executed while the pristine memory devices (1) are still on the wafer. After being conditioned, the wafer is diced into memory chips. The diced memory chip containing the array of conditioned memory devices (1) is packaged while the Low Resistance State (LRS) or set state of the packaged and conditioned memory device (1) is essentially unaffected by this packaging process.

Figure 1:
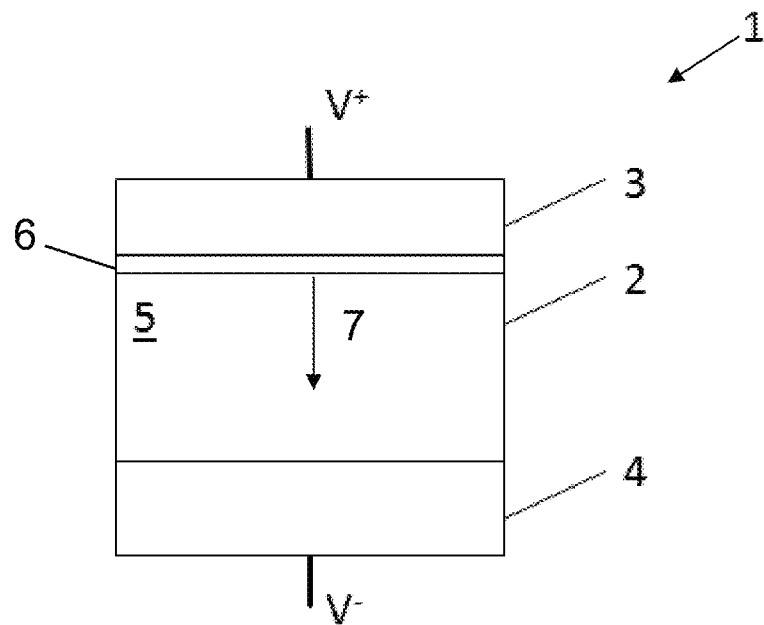
FIG. 1 illustrates a CBRAM device according to the disclosure.

Such CBRAM device (1) is illustrated in FIG. 1. Here a Conductive Bridge Random Access Memory (CBRAM) device (1) is shown comprising an insulating electrolyte element (2) sandwiched between a cation supply top metal electrode (3) and an inert bottom electrode (4). The bottom electrode (4) is labelled 'inert' as it does not provide cations during the filament forming process.

As discussed in the following paragraphs, the CBRAM device (1) may be formed using materials and methods compatible with CMOS processing. This compatibility allows integration of the CBRAM device (1) on a CMOS substrate, i.e. a semiconductor substrate comprising logic devices, such as field effect transistors, for controlling the operation of the memory device (1).

The dielectric material (5) of the electrolyte element (2) may be selected from the group of alumina oxides, hafnium oxides, tantalum oxides, silicon oxides, tungsten oxides, silicon nitrides, or combinations thereof.

The cation supply electrode (3) can comprise Cu or Ag, supplying respectively $Cu^+$ and $Ag^+$ cations during programming. In one example, the cation supply electrode (3) is a Cu alloy, such as Cu—Te, Cu—Ge, Cu—Ge—Te, Cu—Te—C, Cu—Ti, and the like.

Optionally, a metallic liner (6) is formed, separating the cation supply electrode (3) from the electrolyte element (2). In case a Cu or Ag containing top electrode (3) is formed, this metallic layer (6) contains Ta or TiW.

In one example, the bottom electrode (4) comprises tungsten. For instance, the bottom electrode (4) may be formed of tungsten or titanium-nitride, e.g. TiN.

When biasing ($V^+$-$V^-$) the top electrode (3) positive with respect to the bottom electrode (4) of such a CBRAM device (1), an electrical field is applied over the electrolyte element (2). A conductive filament then grows (7) from the cation supply metal top electrode (3) towards the bottom layer (4) due to cation reduction, $M^+ \rightarrow M$, within the electrolyte element (2).

Such a pristine Conductive Bridge Random Access Memory (CBRAM) device (1) is conditioned, i.e. an initial conductive filament is formed, by applying a forming current pulse having a pulse amplitude ($I_f$) of 10 uA (micro-Ampere) or less, such as 5 uA or less, or 1 uA or less, whereby the pulse amplitude is higher than zero.

If the electrolyte element (2) comprises or consists of silicon-oxide, or tungsten oxide, the amplitude of the forming current ($I_f$) can be 5 uA or less.

In one example, the forming current pulse has a pulse width ($t_f$) of 100 ns (nanoseconds) or less, such as 50 ns or less, whereby the pulse width is higher than zero. In case an array of such memory devices (1) is conditioned, the memory devices (1) in the array can be conditioned in parallel instead of sequentially, thereby increasing the throughput of the conditioning step.

Figure 2:
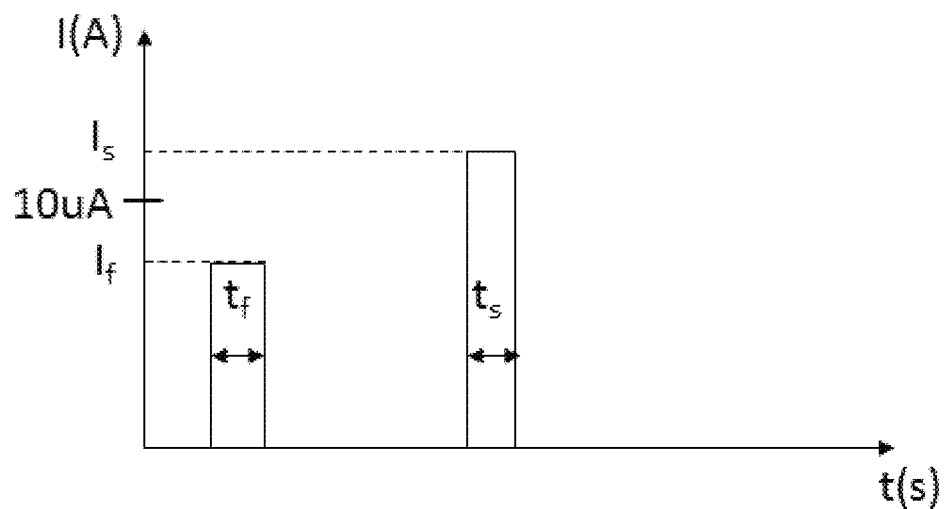
FIG. 2 illustrates a forming and set programming step according to the disclosure.

A memory device (1), conditioned as discussed in the foregoing paragraphs using a short current forming pulse, can then be programmed. When setting this memory device (1), i.e. bringing it into a Low Resistive State (LRS), a set current pulse is applied. This set current pulse has a pulse width ($t_s$) of 100 ns or less, but higher than zero, such as 50 ns or less, whereby its current pulse amplitude ($I_s$) is equal to or higher than the amplitude ($I_f$) of current pulse applied to form this memory device (1). For instance, this set current pulse amplitude ($I_s$) is above 10 uA. FIG. 2 illustrates the relative amplitudes of the forming and set current pulse according to this disclosure.

Figure 3:
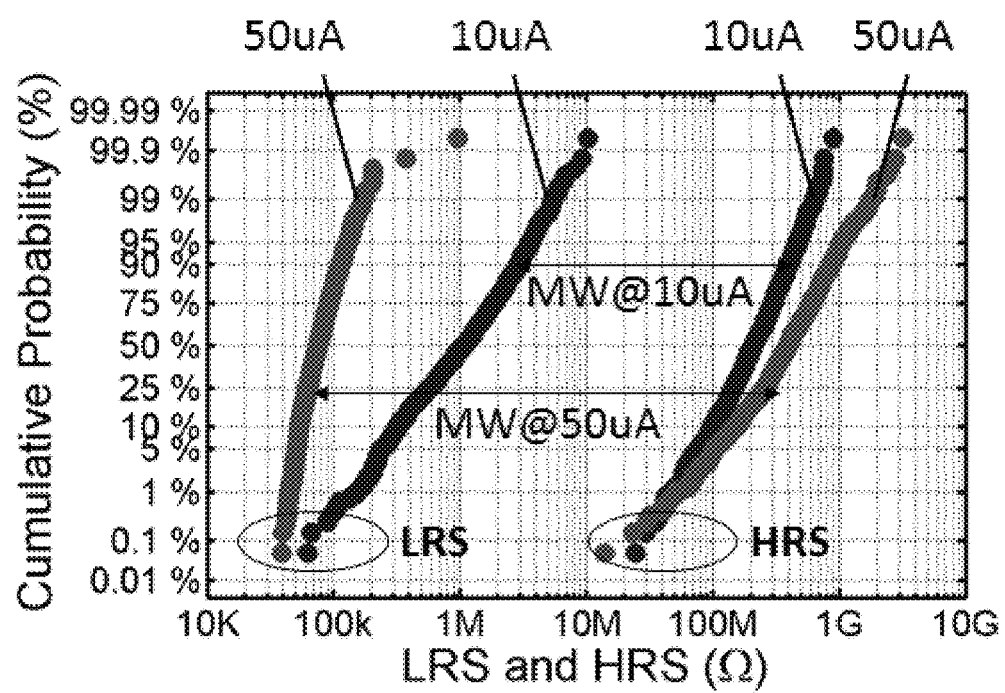
FIG. 3 illustrates the impact of the amplitude ($I_s$) of the set current on the Low Resistive State (LRS) and on the High Resistive State (HRS) state.

The amplitude ($I_s$) of this set current pulse now differs from the amplitude ($I_f$) of the forming current pulse. Hence, one can select the set current pulse amplitude ($I_s$) in view of or based on the resistance value desired in the Low Resistive State (LRS). As illustrated in FIG. 3, two values for this amplitude were applied ($I_s$=10 uA or 50 uA). This difference in set current pulse amplitude ($I_s$) only had limited impact on the resistance value obtained during the subsequent High Resistive State (HRS). The corresponding resistance value of the LRS was noticeably shifted to lower values when increasing the set current pulse amplitude ($I_s$). The memory window (MW), even at 10 uA, still allows distinguishing the Low Resistive State from the High Resistive State. In one example, the amplitude of the set current pulse is above 10 uA and below 500 uA, such as above 10 uA, and up to and including 50 uA.

As this set current pulse amplitude ($I_s$) can be selected substantially independently from the resistance value of the FIRS and of the forming state, with the limitations discussed above, one can program the memory device (1) to different low resistance levels in the LRS depending on the set current pulse amplitude ($I_s$) applied. The current disclosure thus allows multilevel cell programming, whereby the set current pulse amplitude ($I_s$) is determined in view of a Low Resistance State selected from a set of Low Resistance States.

Although the set current pulse amplitude ($I_s$) may be selected to be equal to or higher than the amplitude ($I_f$) of the current pulse applied to form this memory device (1), one can apply a current pulse amplitude lower than this forming current pulse amplitude. Such a lower set current pulse amplitude results in a higher value of the Low Resistive State as illustrated by FIG. 3. This broadens the range of the set current amplitude from which to select in order to reversibly switch between different values of the Low Resistive State.

What is claimed is:

1. A method for operating a memory comprising at least one Conductive Bridge Random Access Memory (CBRAM) device, the at least one CBRAM device comprising an electrolyte element sandwiched between a cation supply top electrode and an inert bottom electrode, the method comprising:
    conditioning the at least one CBRAM device by applying a forming current pulse having a pulse amplitude ($I_f$) of 10 uA or less.

2. The method of claim 1, wherein the pulse amplitude ($I_f$) is 1 uA or less.

3. The method of claim 2, wherein the forming current pulse has a pulse width ($t_f$) of 100 ns or less.

4. The method of claim 1, wherein the memory comprises an array of the CBRAM devices, whereby the CBRAM devices in the array are conditioned in parallel.

5. The method of claim 1, further comprising setting the conditioned at least one CBRAM device to a Low Resistance State (LRS) by applying a set current pulse having a pulse width ($t_s$) of 100 ns or less, and a current pulse amplitude ($I_s$) equal to or higher than the forming current pulse amplitude ($I_f$).

6. The method claim 5, wherein the set current pulse amplitude ($I_s$) is above 10 uA.

7. The method claim 5, wherein the set current pulse amplitude ($I_s$) is less than the forming current pulse amplitude ($I_f$).

8. The method of claim 5, further comprising determining the set current pulse amplitude ($I_s$) based on a LRS selected from a set of LRSs.

9. The method of claim 1, wherein the cation supply top electrode comprises copper or silver.

10. The method of claim 1, wherein the inert bottom electrode comprises tungsten or titanium-nitride.

11. The method of claim 1, wherein the electrolyte element comprises alumina-oxide, silicon-oxide, tungsten-oxide, silicon-nitride, or a combination thereof.

\* \* \* \* \*